United States Patent
Huang

(10) Patent No.: US 9,905,918 B2
(45) Date of Patent: Feb. 27, 2018

(54) ELECTRONIC APPARATUS AND LAND GRID ARRAY MODULE

(71) Applicant: Huawei Device Co., Ltd., Shenzhen (CN)

(72) Inventor: Benwei Huang, Shenzhen (CN)

(73) Assignee: HUAWEI DEVICE CO., LTD., Shenzhen (CN)

( * ) Notice: Subject to any disclaimer, the term of this patent is extended or adjusted under 35 U.S.C. 154(b) by 468 days.

(21) Appl. No.: 14/580,991

(22) Filed: Dec. 23, 2014

(65) Prior Publication Data

US 2015/0116186 A1    Apr. 30, 2015

Related U.S. Application Data

(63) Continuation of application No. PCT/CN2013/089994, filed on Dec. 19, 2013.

(30) Foreign Application Priority Data

Dec. 21, 2012   (CN) .......................... 2012 1 0562834

(51) Int. Cl.
*H01Q 1/22*   (2006.01)
*H01Q 1/50*   (2006.01)
(Continued)

(52) U.S. Cl.
CPC ................ *H01Q 1/50* (2013.01); *H01Q 1/22* (2013.01); *H05K 1/0243* (2013.01); *H05K 1/111* (2013.01);
(Continued)

(58) Field of Classification Search
CPC ........ H05K 1/0243; H05K 1/111; H05K 1/18; H05K 1/141; H05K 2201/094;
(Continued)

(56) References Cited

U.S. PATENT DOCUMENTS 6,392,605 B2   5/2002   Anterow
6,982,879 B1*  1/2006   Franca-Neto ........ H01Q 9/0407
                                              343/700 MS
(Continued)

FOREIGN PATENT DOCUMENTS

CN      101394191 A     3/2009
CN      102237342 A     11/2011
(Continued)

OTHER PUBLICATIONS

Foreign Communication From a Counterpart Application, Japanese Application No. 2015538280, Japanese Office Action dated Jun. 14, 2016, 4 pages.
(Continued)

*Primary Examiner* — Dameon E Levi
*Assistant Examiner* — Hasan Islam
(74) *Attorney, Agent, or Firm* — Conley Rose, P.C.

(57) ABSTRACT

An electronic apparatus and a land grid array LGA module. The electronic apparatus includes: a first printed circuit board, a lower surface of the first printed circuit board is provided with a first radio frequency pad and a first non-radio frequency pad; a motherboard, including a second printed circuit board, where an upper surface of the second printed circuit board is provided with a second radio frequency pad and a second non-radio frequency pad, the first radio frequency pad is connected to the second radio frequency pad, and the first non-radio frequency pad is connected to the second non-radio frequency pad; an antenna, located on the motherboard and connected to the second radio frequency pad, the first radio frequency pad and the second radio frequency pad are configured to transmit, between the LGA module and the motherboard, a radio frequency signal transmitted by the antenna.

20 Claims, 8 Drawing Sheets

(51) Int. Cl.
*H05K 1/18* (2006.01)
*H05K 1/02* (2006.01)
*H05K 1/11* (2006.01)
*H05K 1/14* (2006.01)
*H05K 1/16* (2006.01)

(52) U.S. Cl.
CPC ............... *H05K 1/18* (2013.01); *H05K 1/141* (2013.01); *H05K 1/16* (2013.01); *H05K 2201/094* (2013.01); *H05K 2201/10098* (2013.01); *H05K 2201/10719* (2013.01); *Y02P 70/611* (2015.11)

(58) Field of Classification Search
CPC .......... H05K 2201/10098; H05K 2201/10719; H01Q 1/22
USPC ......................................... 361/760, 782, 783
See application file for complete search history.

(56) References Cited

U.S. PATENT DOCUMENTS

| | | | |
|---|---|---|---|
| 7,898,093 | B1 | 3/2011 | Darveaux et al. |
| 2003/0214792 | A1 | 11/2003 | Credelle et al. |
| 2007/0296520 | A1 | 12/2007 | Hosokawa et al. |
| 2009/0021446 | A1 | 1/2009 | Kataya et al. |
| 2009/0051606 | A1 | 2/2009 | Ochi et al. |
| 2009/0116203 | A1 | 5/2009 | Matsuno et al. |
| 2011/0032685 | A1 | 2/2011 | Akiba et al. |
| 2012/0242547 | A1* | 9/2012 | Fujii ........................ H01Q 1/38 343/700 MS |
| 2012/0248601 | A1 | 10/2012 | Anderson et al. |
| 2013/0107484 | A1 | 5/2013 | Sakuma et al. |
| 2013/0114218 | A1 | 5/2013 | Itagaki et al. |

FOREIGN PATENT DOCUMENTS

| | | | |
|---|---|---|---|
| GB | 2345022 | A | 6/2000 |
| JP | 2005347889 | A | 12/2005 |
| JP | 2005354407 | A | 12/2005 |
| JP | 2006014102 | A | 1/2006 |
| JP | 20070184325 | A | 7/2007 |
| JP | 2008016776 | A | 1/2008 |
| JP | 20090135470 | A | 6/2009 |
| JP | 2010086987 | A | 4/2010 |
| JP | 2013098888 | A | 5/2013 |
| WO | 101542830 | A | 9/2009 |
| WO | 101996979 | A | 3/2011 |
| WO | 2012017507 | A1 | 2/2012 |

OTHER PUBLICATIONS

Foreign Communication From a Counterpart Application, Japanese Application No. 2015538280, English Translation of Japanese Office Action dated Jun. 14, 2016, 5 pages.
Huawei, "Development Board Guide," XP055331534, Huawei MU739 HSPA+ LGA Module, Issue 1, Dec. 28, 2011, 14 pages.
Huawei, "Hardware Guide," XP055331572, Huawei MU739 HSPA+ LGA Module, Issue 10, Feb. 12, 2015, 81 pages.
Foreign Communication From a Counterpart Application, European Application No. 13864172.5, European Oral Proceedings dated Jan. 20, 2017, 14 pages.
"Hardware Guide," Huawei MU739 HSPA+ LGA Module, Draft 2, Aug. 24, 2011, 90 pages.
Foreign Communication From a Counterpart Application, European Application No. 13864172.5, Extended European Search Report dated Aug. 3, 2015, 6 pages.
Partial English Translation and Abstract of Chinese Patent Application No. CN102237342A, Jan. 22, 2015, 5 pages.
Foreign Communication From a Counterpart Application, PCT Application No. PCT/CN2013/089994, International Search Report dated Apr. 3, 2014, 8 pages.
Foreign Communication From a Counterpart Application, PCT Application No. PCT/CN2013/089994, Written Opinion dated Apr. 3, 2014, 5 pages.
"Huawei MU739—3G/HSPA+ LGA Module—21Mbps D/L—5.76Mbps U/L," XP055265723, Retrieved from the Internet: URL:https://web.archive.org/web/20121130220918/http://www.techship.se/products/huawei-mu739/ [retrieved on Apr. 15, 2016] Nov. 30, 2012, 5 pages.
"Huawei MU739 Datasheet," XP055265744, Retrieved from the Internet: URL: https://techship.se/download/huawei-mu739-datasheet/ [retrieved on Apr. 15, 2016], Sep. 14, 2012, 2 pages.
"Huawei MU739 HSPA+ LGA Module Issue 6," XP055265841, May 8, 2013, 12 pages.
Foreign Communication From a Counterpart Application, European Application No. 13864172.5, European Office Action dated May 6, 2016, 7 pages.
Foreign Communication From a Counterpart Application, Chinese Application No. 201210562834.2, Chinese Search Report dated Apr. 14, 2016, 2 pages.
Foreign Communication From a Counterpart Application, Chinese Application No. 201210562834.2, Chinese Office Action dated Apr. 22, 2016, 7 pages.
Foreign Communication From a Counterpart Application, European Application No. 13864172.5, European Notice of Rejection dated Jun. 27, 2017, 29 pages.

* cited by examiner

ELECTRONIC APPARATUS AND LAND GRID ARRAY MODULE

CROSS-REFERENCE TO RELATED APPLICATION

This application is a continuation of International Application No. PCT/CN2013/089994, filed on Dec. 19, 2013, which claims priority to Chinese Patent Application No. 201210562834.2, filed on Dec. 21, 2012, which is hereby incorporated by reference in its entirety.

TECHNICAL FIELD

The present invention relates to the field of electronic technologies, and in particular, to an electronic apparatus and a land grid array module.

BACKGROUND

Land grid array (LGA) modules gain increasingly wide use in the fields of communications, vehicle-mounting, and consumer electronics, as well as other special fields. An LGA module has comprehensive functions. For example, the LGA module generally has such functions as radio reception, signal processing, and radio transmission. The LGA module includes a printed circuit board (PCB) and a pad. Because of a high wiring density of the LGA module, a high density interconnect (HDI) printed circuit board is usually used as the printed circuit board of the LGA module. The HDI printed circuit board has a relatively thin medium and a relatively small size, and allows smaller device spacing.

Antennas connected to an LGA module usually include a primary antenna, a secondary antenna, a Global Positioning System (GPS) antenna, and the like. Because an LGA module has a very small area, there is no enough room for placing antennas; therefore, the antennas and the LGA module are usually separately disposed on a motherboard, which incurs a problem of interconnecting the antennas and the LGA module.

Exemplary antennas are first connected to a Small A Type (SMA) connector of a motherboard through wires of a printed circuit board of the motherboard, and then connected to an SMA connector of an LGA module through a cable, thereby implementing interconnection between the antennas and the LGA module on the motherboard.

After the LGA module is mounted onto the motherboard, the bottom surface of the LGA module faces the motherboard, and the SMA connector of the LGA module is disposed on the top surface of the LGA module. The SMA connector of the LGA module occupies some surface area, which reduces effective layout space of the LGA module.

SUMMARY

Embodiments of the present invention provide an electronic apparatus and a land grid array module, which can increase effective layout space of an LGA module.

According to a first aspect, an electronic apparatus is provided, which includes: a land grid array LGA module, including a first printed circuit board, where a lower surface of the first printed circuit board is provided with a first radio frequency pad and a first non-radio frequency pad; a motherboard, including a second printed circuit board, where an upper surface of the second printed circuit board is provided with a second radio frequency pad and a second non-radio frequency pad, where the first radio frequency pad is connected to the second radio frequency pad, and the first non-radio frequency pad is connected to the second non-radio frequency pad; and an antenna, located on the motherboard and connected to the second radio frequency pad, where a size of the first radio frequency pad is less than a size of the second non-radio frequency pad, a size of the second radio frequency pad is less than a size of the first non-radio frequency pad, and the first radio frequency pad and the second radio frequency pad are configured to transmit, between the LGA module and the motherboard, a radio frequency signal transmitted by the antenna.

In a first possible implementation manner, length ranges of the first radio frequency pad and the second radio frequency pad are from 0.4 millimeters (mm) to 1.2 mm, and width ranges of the first radio frequency pad and the second radio frequency pad are from 0.4 mm to 0.8 mm.

With reference to the first possible implementation manner of the first aspect, in a second possible implementation manner, lengths of the first radio frequency pad and the second radio frequency pad are 1.0 mm, and widths of the first radio frequency pad and the second radio frequency pad are 0.6 mm.

With reference to the first aspect or any one of the foregoing possible implementation manners of the first aspect, in a third possible implementation manner, the first radio frequency pad, the first non-radio frequency pad, and the second radio frequency pad are rectangles, where a long side of the first radio frequency pad is parallel to a long side of the first non-radio frequency pad, and a short side of the first radio frequency pad is parallel to a short side of the first non-radio frequency pad.

With reference to the first aspect or any one of the foregoing possible implementation manners of the first aspect, in a fourth possible implementation manner, the first radio frequency pad, the first non-radio frequency pad, and the second radio frequency pad are rectangles, where a short side of the first radio frequency pad is parallel to a long side of the first non-radio frequency pad, and a long side of the first radio frequency pad is parallel to a short side of the first non-radio frequency pad.

With reference to the first aspect or any one of the foregoing possible implementation manners of the first aspect, in a fifth possible implementation manner, the lower surface of the first printed circuit board is further provided with a first empty network pad, a preset clearance exists between the first radio frequency pad and the first empty network pad, and a size and a shape of an area jointly occupied by the first radio frequency pad and the first empty network pad are consistent with a size and a shape of an area occupied by the first non-radio frequency pad; and the upper surface of the second printed circuit board is provided with a second empty network pad, and a preset clearance exists between the second radio frequency pad and the second empty network pad, where the first empty network pad is connected to the second empty network pad.

With reference to the first aspect or any one of the foregoing possible implementation manners of the first aspect, in a sixth possible implementation manner, a distance between the first radio frequency pad and a printed wire (or a printed circuit) on the lower surface of the first printed circuit board is greater than 0.2 mm; and a distance between the second radio frequency pad and a printed wire on the upper surface of the second printed circuit board is greater than 0.2 mm.

With reference to any one of the foregoing possible implementation manners of the first aspect, in a seventh possible implementation manner, a distance between the first radio frequency pad and a printed wire inside the first printed circuit board is greater than 0.2 mm.

According to a second aspect, an electronic apparatus is provided, which includes: a land grid array LGA module, including a first printed circuit board, where a lower surface of the first printed circuit board is provided with a first radio frequency pad; a motherboard, including a second printed circuit board, where an upper surface of the second printed circuit board is provided with a second radio frequency pad, where the first radio frequency pad is connected to the second radio frequency pad, length ranges of the first radio frequency pad and the second radio frequency pad are from 0.4 mm to 1.2 mm, and width ranges of the first radio frequency pad and the second radio frequency pad are from 0.4 mm to 0.8 mm; and an antenna, located on the motherboard and connected to the second radio frequency pad, where the first radio frequency pad and the second radio frequency pad are configured to transmit, between the LGA module and the motherboard, a radio frequency signal transmitted by the antenna.

In a first possible implementation manner, lengths of the first radio frequency pad and the second radio frequency pad are 1.0 mm, and widths of the first radio frequency pad and the second radio frequency pad are 0.6 mm.

With reference to the second aspect or the first possible implementation manner of the second aspect, in a second possible implementation, a distance between the first radio frequency pad and a printed wire on the lower surface of the first printed circuit board is greater than 0.2 mm; and a distance between the second radio frequency pad and a printed wire on the lower surface of the second printed circuit board is greater than 0.2 mm.

With reference to the second aspect or the first and the second possible implementation manners of the second aspect, in a third possible embodiment, the lower surface of the first printed circuit board is further provided with a first empty network pad, and a preset clearance exists between the first radio frequency pad and the first empty network pad.

With reference to any one of the foregoing possible implementation manners of the second aspect, in a fourth possible embodiment, a distance between the first radio frequency pad and a printed wire inside the first printed circuit board is greater than 0.2 mm.

According to a third aspect, a land grid array LGA module is provided, which includes: a first printed circuit board, where a lower surface of the first printed circuit board is provided with a first radio frequency pad, a length range of the first radio frequency pad is from 0.4 mm to 1.2 mm, and a width range of the first radio frequency pad is from 0.4 mm to 0.8 mm.

In a first possible implementation manner, a length of the first radio frequency pad is 1.0 mm, and a width of the first radio frequency pad is 0.6 mm.

With reference to the third aspect or the first possible implementation manner of third aspect, in a second possible implementation manner, a distance between the first radio frequency pad and a printed wire on the lower surface of the first printed circuit board is greater than 0.2 mm.

With reference to the third aspect or any one of the foregoing possible implementation manners of the third aspect, a distance between the first radio frequency pad and a printed wire inside the first printed circuit board is greater than 0.2 mm.

With reference to the third aspect or the first possible implementation manner or the second possible implementation manner of the third aspect, the lower surface of the first printed circuit board is further provided with a first empty network pad, and a preset clearance exists between the first radio frequency pad and the first empty network pad.

According to a fourth aspect, a land grid array LGA module is provided, which includes: a printed circuit board, where a lower surface of the printed circuit board is provided with a first radio frequency pad and a first non-radio frequency pad, and a size of the first radio frequency pad is less than a size of the first non-radio frequency pad.

In a first possible implementation manner, a length range of the first radio frequency pad is from 0.4 mm to 1.2 mm, and a width range of the first radio frequency pad is from 0.4 mm to 0.8 mm.

With reference to the first possible implementation manner of the fourth aspect, in a second possible implementation manner, a length of the first radio frequency pad is 1.0 mm, and a width of the first radio frequency pad is 0.6 mm.

With reference to the fourth aspect or any one of the foregoing possible implementation manners of the fourth aspect, in a third possible implementation manner, a distance between the first radio frequency pad and a printed circuit on the lower surface of the first printed circuit board is greater than 0.2 mm.

With reference to the fourth aspect or any one of the foregoing possible implementation manners of the fourth aspect, in a fourth possible implementation manner, a distance between the first radio frequency pad and a printed wire inside the first printed circuit board is greater than 0.2 mm.

In the embodiments of the present invention, a radio frequency pad of an LGA module can be connected to a radio frequency pad of a motherboard, and the radio frequency pad of the motherboard is connected to an antenna, so that a radio frequency signal on the LGA module can be transmitted to the antenna. Because the radio frequency pad of the LGA module is located on a bottom surface of the LGA module, and does not occupy space of a top surface of the LGA module, effective layout space of the LGA module is increased.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

In order to increase effective layout space of an LGA module, an antenna may be first connected to a radio frequency pad of a motherboard through a wire on a printed circuit board of the motherboard, and then connected to a radio frequency pad of an LGA module by using the radio frequency pad of the motherboard, thereby implementing interconnection between the antenna and the LGA module. The LGA module and the motherboard may further be provided with a pad configured to transmit non-radio frequency signals (hereinafter referred to as a non-radio frequency pad). The non-radio frequency pad generally has a relatively large size. For example, a length may be 1.5 mm, and a width may be 1.0 mm. If sizes of the radio frequency pads of the LGA module and the motherboard are the same as the size of the non-radio frequency pad, high parasitic capacitance will be generated between the radio frequency pads and a printed circuit (for example, a copper sheet) on an adjacent layer or a same layer due to the relatively large size of the non-radio frequency pad. Because a medium of the LGA module has a small thickness, but the radio frequency pad has a relatively large surface area, the parasitic capacitance generated by the radio frequency pad is higher. When a radio frequency signal passes through the radio frequency pad, it is equivalent to the effect that a relatively large capacitor is connected in parallel to a radio frequency signal path, which results in impedance discontinuity, so that insertion loss in the radio frequency signal path is relatively large. In addition, because impedance discontinuity has great impact on a high frequency signal, impedance consistency is relatively poor within a wider range from a low frequency to a high frequency (for example, a frequency range of an antenna of an LGA module that supports a third generation mobile communications system is from 0.5 GHz to 3 GHz, and a frequency range of an antenna of an LGA module that supports a Long Term Evolution communications system is from 0.5 GHz to 4 GHz). That is, impedance convergence is relatively poor, so that matching and scheduling of multiple frequency bands are difficult.

Figure 1A:
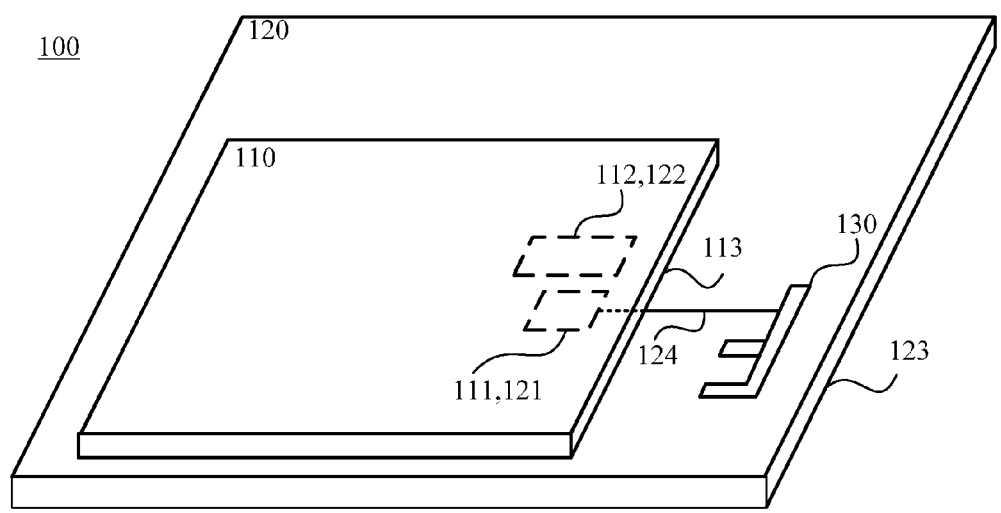
FIG. 1A is a schematic structural diagram of an electronic apparatus according to an embodiment of the present invention.
Figure 1B:
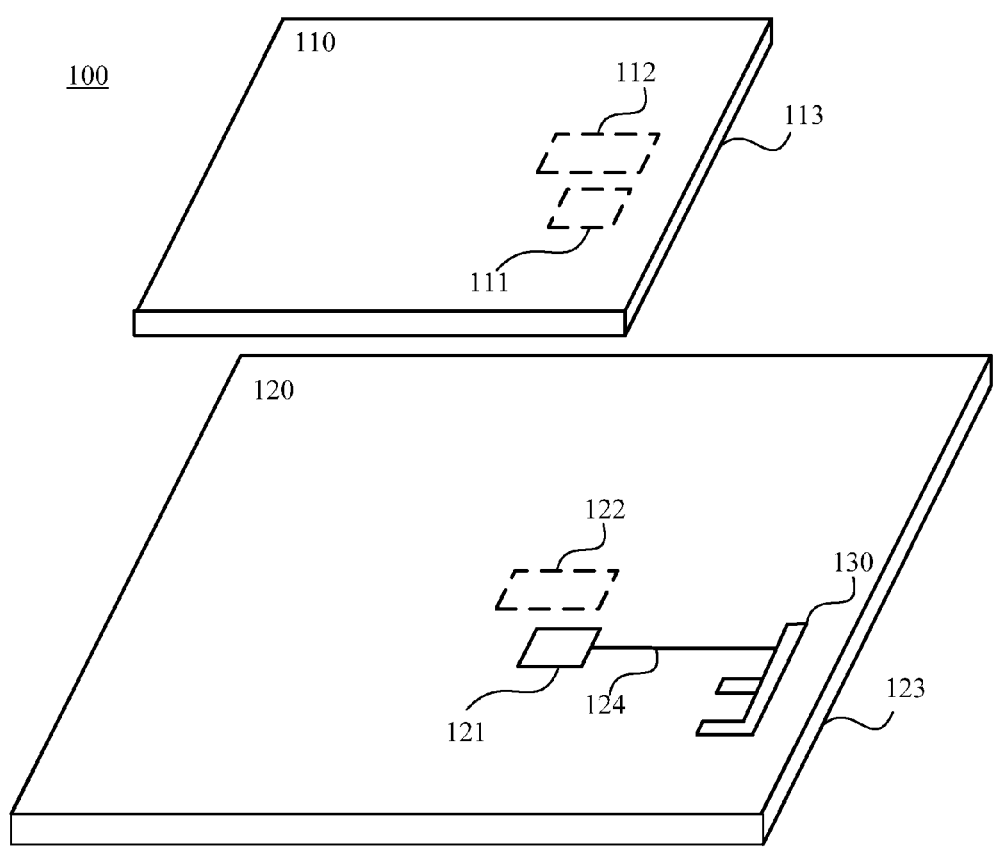
FIG. 1B is a schematic exploded diagram of the electronic apparatus according to the embodiment shown in FIG. 1A.

FIG. 1A is a schematic structural diagram of an electronic apparatus 100 according to an embodiment of the present invention. FIG. 1B is a schematic exploded diagram of the electronic apparatus 100 according to the embodiment shown in FIG. 1A. The electronic apparatus 100 of the present invention is described with reference to FIG. 1A and FIG. 1B in the following. The electronic apparatus 100 includes a land grid array LGA module 110, a motherboard 120, and an antenna 130.

The land grid array LGA module 110 includes a first printed circuit board 113, where a lower surface of the first printed circuit board 113 is provided with a first radio frequency pad 111 and a first non-radio frequency pad 112.

For example, the first radio frequency pad 111 and the first non-radio frequency pad 112 may be placed on the lower surface of the first printed circuit board 113. An outer surface of the first radio frequency pad 111 may be level with the lower surface of the first printed circuit board 113, but the embodiment of the present invention is not limited thereto. For example, the outer surface of the first radio frequency pad 111 may not be level with the lower surface of the first printed circuit board 113 (for example, higher than or lower than the lower surface of the printed circuit board).

The motherboard 120 includes a second printed circuit board 123, where an upper surface of the second printed circuit board 123 is provided with a second radio frequency pad 121 and a second non-radio frequency pad 122. The first radio frequency pad 111 is connected to the second radio frequency pad 121, and the first non-radio frequency pad 112 is connected to the second non-radio frequency pad 122.

For example, when the LGA module 110 is mounted onto the motherboard 120, the first radio frequency pad 111 of the LGA module 110 may be soldered (for example, by using soldering tin) to the second radio frequency pad 121 of the motherboard 120, and the first non-radio frequency pad 112 may be soldered to the second non-radio frequency pad 122, so that the LGA module 110 abuts on the motherboard 120. The second radio frequency pad 122 of the motherboard 120 corresponds to the first radio frequency pad 111 of the LGA module 110, and the second non-radio frequency pad 122 corresponds to the first non-radio frequency pad 112. An outer surface of the second radio frequency pad 121 may be level with the upper surface of the second printed circuit board 123, but the embodiment of the present invention is not limited thereto. For example, the second radio frequency pad 121 may not be level with the upper surface of the second printed circuit board 123 (for example, higher than or lower than the lower surface of the printed circuit board).

The antenna 130 is located on the motherboard 120, and is connected to the second radio frequency pad 121. A size of the first radio frequency pad 111 is less than a size of the first non-radio frequency pad 112. A size of the second radio frequency pad is less than a size of the second non-radio frequency pad 122. The first radio frequency pad 111 and the second radio frequency pad 121 are configured to transmit, between the LGA module 110 and the motherboard 120, a radio frequency signal transmitted by the antenna 130. The size of the first radio frequency pad 111 may equal the size of the second radio frequency pad 121. Here, the sizes of the first radio frequency pad 111 and the second radio frequency pad 121 may refer to surface areas of soldering surfaces of the first radio frequency pad 111 and the second radio frequency pad 121. The size of the first non-radio frequency pad 112 may equal the size of the second non-radio frequency pad 122. Here, the sizes of the first non-radio frequency pad 112 and the second non-radio frequency pad 122 may refer to surface areas of soldering surfaces of the first non-radio frequency pad 112 and the second non-radio frequency pad 122.

For example, the antenna 130 is connected to the second radio frequency pad 121 of the motherboard 120 through a wire 124 on the second printed circuit board 123 of the motherboard 120, but the embodiment of the present invention is not limited thereto. For example, the antenna 130 may also be connected to the second radio frequency pad 121 of the motherboard 120 through a leading wire independent of the second printed circuit board 123. The first non-radio frequency pad 112 is configured to transmit a non-radio frequency signal. That is, a signal except the radio frequency signal can be transmitted.

According to the embodiment of the present invention, when the LGA module 110 is mounted onto the motherboard 120, the LGA module 110 can be connected to the motherboard 120 by using the first radio frequency pad 111 and the second radio frequency pad 121, and the motherboard 120 can be connected to the antenna 130 through a wire or a leading wire. Therefore, interconnection between the LGA module 110 and the antenna 130 is implemented, and the radio frequency signal transmitted by the antenna 130 can be transmitted between the antenna 130 and the LGA module 110.

It should be noted that, the second printed circuit board in this embodiment may be a printed circuit board including at least one layer, for example, a one-layer printed circuit board, a two-layer printed circuit board, or a three-layer printed circuit board.

It should be understood that, according to the embodiment of the present invention, the size of the first radio frequency pad is the same as the size of the second radio frequency pad, and there may also be a tolerance between the size of the first radio frequency pad and the size of the second radio frequency pad. The size of the first non-radio frequency pad 112 is the same as the size of the second non-radio frequency pad 122, and there may also be a tolerance between the size of the first non-radio frequency pad 112 and the size of the second non-radio frequency pad 122.

In the embodiment of the present invention, a radio frequency pad of an LGA module can be connected to a radio frequency pad of a motherboard, and the radio frequency pad of the motherboard is connected to an antenna, so that a radio frequency signal on the LGA module can be transmitted to the antenna. Because the radio frequency pad of the LGA module is located on a bottom surface of the LGA module, and does not occupy space of a top surface of the LGA module, effective layout space of the LGA module is increased.

In addition, in the embodiment of the present invention, a size of a radio frequency pad may be set to be less than a size of a non-radio frequency pad, so as to reduce capacitance generated by the radio frequency pad and improve impedance continuity of a radio frequency loop, thereby reducing insertion loss and increasing radio frequency sensitivity. Better impedance continuity achieves better impedance convergence in a wide frequency band range, so that testing and adjusting for multiple frequency bands is easier.

For ease of description, only one antenna is described in the foregoing embodiment, an LGA module is provided with one radio frequency pad and one non-radio frequency pad, and a motherboard is provided with one radio frequency pad. It may be understood by a person skilled in the art that the LGA module or the motherboard may be provided with multiple radio frequency pads and multiple non-radio frequency pads. Radio frequency pads of the LGA module are in one-to-one correspondence with radio frequency pads of the motherboard, and in one-to-one correspondence with antennas, and the number of non-radio frequency pads may be set according to a requirement.

According to an embodiment of the present invention, a surface area of the first radio frequency pad 111 is less than a surface area of the first non-radio frequency pad 112, and a surface area of the second radio frequency pad 121 is less than the surface area of the first non-radio frequency pad 112.

For example, the surface area of the first radio frequency pad 111 may be the same as the surface area of the second radio frequency pad 121. For example, the surface area of the first radio frequency pad 111 may be ½, ⅓, ¼, ⅕, or the like of the surface area of the first non-radio frequency pad 112. For example, the surface area of the first non-radio frequency pad 112 is 2.5 mm$^2$, and the surface area of the first radio frequency pad 111 is 0.1 mm$^2$ to 1.2 mm$^2$, for example, 0.1 mm$^2$, 0.2 mm$^2$, 0.3 mm$^2$, 0.4 mm$^2$, 0.5 mm$^2$, 0.6 mm$^2$, 0.7 mm$^2$, 0.8 mm$^2$, 0.9 mm$^2$, 1.0 mm$^2$, 1.1 mm$^2$, 1.2 mm$^2$, and the like.

According to an embodiment of the present invention, length ranges of the first radio frequency pad 111 and the second radio frequency pad 121 are from 0.4 mm to 1.2 mm. Width ranges of the first radio frequency pad 111 and the second radio frequency pad 121 are from 0.4 mm to 0.8 mm.

For example, lengths of the first radio frequency pad 111 and the second radio frequency pad 121 may be 0.4 mm, 0.5 mm, 0.6 mm, 0.7 mm, 0.8 mm, 0.9 mm, 1.0 mm, 1.1 mm or 1.2 mm. For example, widths of the first radio frequency pad 111 and the second radio frequency pad 121 may be 0.4 mm, 0.5 mm, 0.6 mm, 0.7 mm or 0.8 mm.

According to an embodiment of the present invention, lengths of the first radio frequency pad 111 and the second radio frequency pad 121 are 1.0 mm, and widths of the first radio frequency pad 111 and the second radio frequency pad 121 are 0.6 mm. In this way, it can be ensured that a radio frequency signal has good impedance convergence in a relatively wide frequency band range (for example, 0.7 GHz to 4 GHz).

According to a result of a performance test conducted on radio frequency pads of various sizes, if a size of a radio frequency pad is less than the smallest size in the foregoing range (for example, the length and width of the foregoing radio frequency pad are less than 0.4 mm), a cost of an equipment test fixture of an LGA module is increased. If the size of the radio frequency pad is greater than the largest size in the foregoing range (for example, the length of the foregoing radio frequency pad is greater than 1.0 mm and the width is greater than 0.8 mm), impedance continuity deteriorates and insertion loss grows.

According to an embodiment of the present invention, the first radio frequency pad 111, the first non-radio frequency pad 112, and the second radio frequency pad 121 are rectangles, a long side of the first radio frequency pad 111 is parallel to a long side of the first non-radio frequency pad 112, and a short side of the first radio frequency pad 111 is parallel to a short side of the first non-radio frequency pad 112.

According to an embodiment of the present invention, the first radio frequency pad 111, the first non-radio frequency pad 112, and the second radio frequency pad 121 are rectangles, a short side of the first radio frequency pad 111 is parallel to a long side of the first non-radio frequency pad 112, and a long side of the first radio frequency pad 111 is parallel to a short side of the first non-radio frequency pad 112.

Optionally, as another embodiment, the lower surface of the first printed circuit board 113 of the LGA module 110 is provided with a first empty network pad. A preset clearance exists between the first radio frequency pad 111 and the first empty network pad (not shown in FIG. 1A). A size of an area jointly occupied by the first radio frequency pad 111 and the first empty network pad (including the preset clearance between the first radio frequency pad 111 and the first empty network pad) is consistent with a size of an area occupied by the first non-radio frequency pad. A shape of the area jointly occupied by the first radio frequency pad 111 and the first empty network pad (including a shape of the preset clearance between the first radio frequency pad 111 and the first empty network pad) is consistent with a shape of the area occupied by the first non-radio frequency pad. The upper surface of the second printed circuit board 123 of the motherboard 120 is provided with a second empty network pad (not shown in FIG. 1A). A preset clearance exists between the second radio frequency pad 121 and the second empty network pad, where the first empty network pad is connected to the second empty network pad. A size of a preset clearance between a radio frequency pad and an empty network pad may be so set that the radio frequency pad and the empty network pad meet a manufacturing process requirement.

Because a size of a radio frequency pad is less than a size of a non-radio frequency pad, space saved can be used to dispose an empty network pad, and the empty network pad can be used to increase soldering reliability of an LGA module and ensure soldering performance. In addition, for ease of manufacturing and mounting, a size and a shape of an area jointly occupied by a radio frequency pad and an empty network pad may be consistent with a size and shape of an area occupied by a non-radio frequency pad.

According to an embodiment of the present invention, a distance between the first radio frequency pad 111 and a printed wire on the lower surface of the first printed circuit board 113 is greater than 0.2 mm (about 8 thousands of an inch (mils)); a distance between the second radio frequency pad 121 and a printed wire on the upper surface of the second printed circuit board 123 is greater than 0.2 mm.

In other words, in the first printed circuit board, no printed circuit (for example, copper sheet) is disposed within a range of at least 0.2 mm from the radio frequency pad, so as to reduce parasitic capacitance between the radio frequency pad and an adjacent printed circuit or pad, thereby avoiding impedance discontinuity of a radio frequency signal at an LGA pad, and ensuring impedance continuity of a radio frequency path of an antenna.

According to an embodiment of the present invention, a distance between the first radio frequency pad 111 and a printed wire inside the first printed circuit board 113 is greater than 0.2 mm. The printed wire may be located at a reference ground above the radio frequency pad. In this way, impedance discontinuity of a radio frequency signal at an LGA pad can be avoided.

Figure 2A:
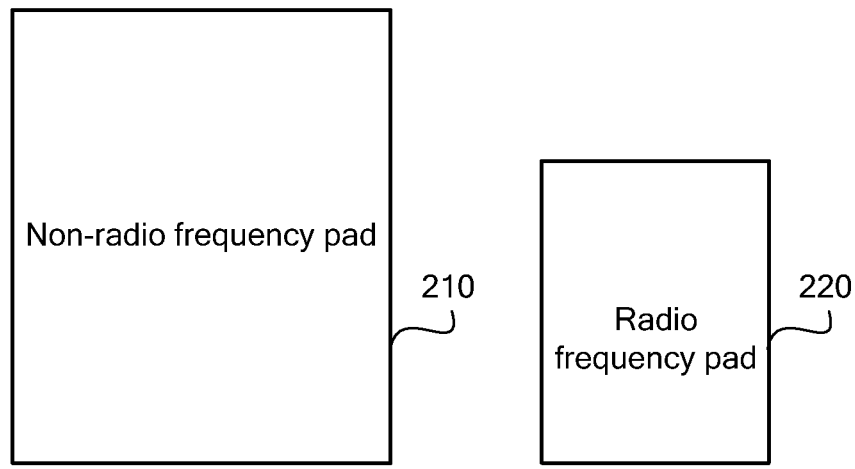
FIG. 2A is a schematic diagram of a non-radio frequency pad and a radio frequency pad according to an embodiment of the present invention.

FIG. 2A is a schematic diagram of a non-radio frequency pad and a radio frequency pad according to an embodiment of the present invention. FIG. 2A illustrates a non-radio frequency pad and a radio frequency pad of the LGA module in the embodiment shown in FIG. 1A using an example.

Refer to FIG. 2A. A non-radio frequency pad 210 and a radio frequency pad 220 may be placed on a same side of an LGA module (that is, a lower surface of the LGA module). A preset clearance may exist between the non-radio frequency pad 210 and the radio frequency pad 220. The radio frequency pad 220 and the non-radio frequency pad 210 are rectangles with right angles. A long side of the radio frequency pad 220 is parallel to a long side of the non-radio frequency pad 210, and a short side of the radio frequency pad 220 is parallel to a short side of the non-radio frequency pad 210. A size of the preset clearance between the radio frequency pad 220 and the non-radio frequency pad 210 may be so set that the radio frequency pad and the non-radio frequency pad meet a manufacturing process requirement.

Figure 2B:
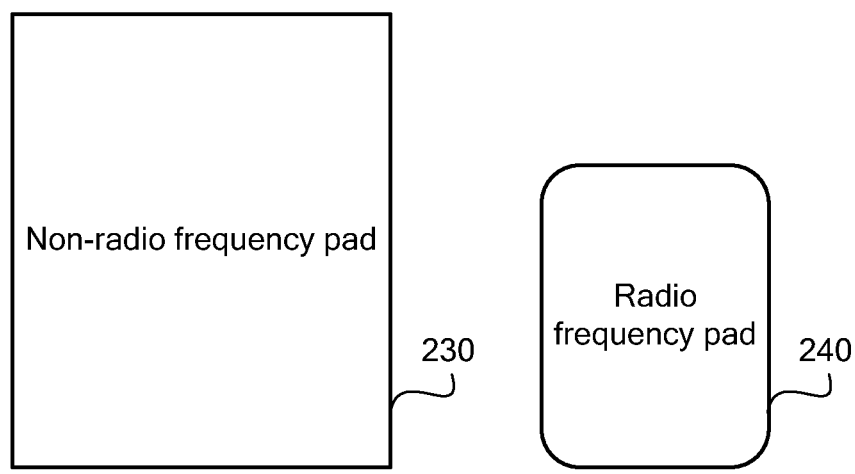
FIG. 2B is a schematic diagram of a non-radio frequency pad and a radio frequency pad according to another embodiment of the present invention.

FIG. 2B is a schematic diagram of a non-radio frequency pad and a radio frequency pad according to another embodiment of the present invention. A non-radio frequency pad 230 and a radio frequency pad 240 in FIG. 2B are similar to the non-radio frequency pad 210 and the radio frequency pad 220 in FIG. 2A, and a difference is that the radio frequency pad 240 is a rounded rectangle.

Figure 2C:
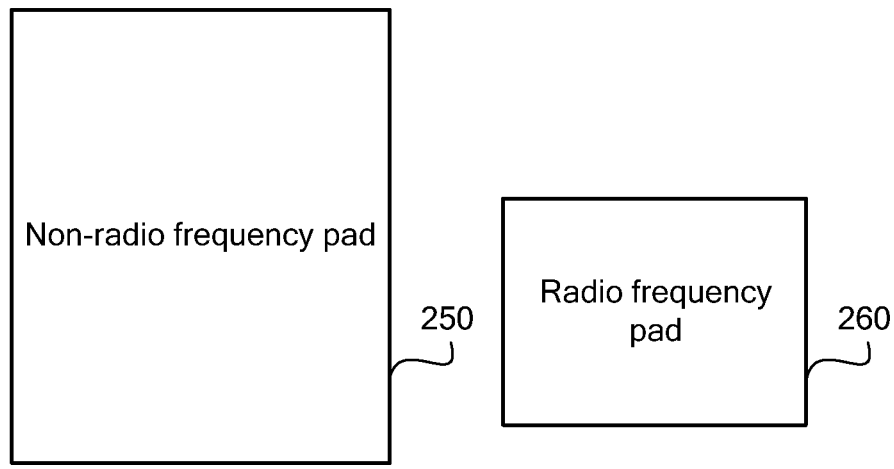
FIG. 2C is a schematic diagram of a non-radio frequency pad and a radio frequency pad according to still another embodiment of the present invention.

FIG. 2C is a schematic diagram of a non-radio frequency pad and a radio frequency pad according to still another embodiment of the present invention. FIG. 2C illustrates a non-radio frequency pad and a radio frequency pad of the LGA module in the embodiment shown in FIG. 1A using an example.

Refer to FIG. 2C. The non-radio frequency pad 250 and the radio frequency pad 260 may be placed on a same side of the LGA module 110 (that is, the lower surface of the LGA module). A non-radio frequency pad 250 and a radio frequency pad 260 are rectangles with right angles. A short side of the radio frequency pad 260 is parallel to a long side of the non-radio frequency pad 250, and a long side of the radio frequency pad 260 is parallel to a short side of the non-radio frequency pad 250.

Figure 2D:
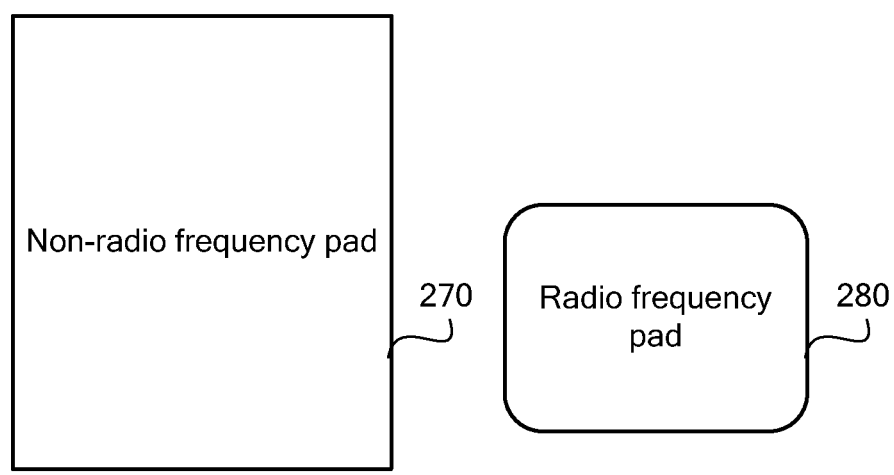
FIG. 2D is a schematic diagram of a non-radio frequency pad and a radio frequency pad according to yet another embodiment of the present invention.

FIG. 2D is a schematic diagram of a non-radio frequency pad and a radio frequency pad according to yet another embodiment of the present invention. A non-radio frequency pad 270 and a radio frequency pad 280 in FIG. 2D are similar to the non-radio frequency pad 250 and the radio frequency pad 260 in FIG. 2C, and a difference is that the radio frequency pad 280 is a rounded rectangle.

It may be understood by a person skilled in the art that a non-radio frequency pad and a radio frequency pad of a motherboard correspond to the non-radio frequency pad and the radio frequency pad of the LGA module, and therefore the non-radio frequency pad and the radio frequency pad of the motherboard have a shape and placement similar to those of the non-radio frequency pad and the radio frequency pad of the LGA module in FIG. 2A to FIG. 2D, which is not described herein again.

Figure 3A:
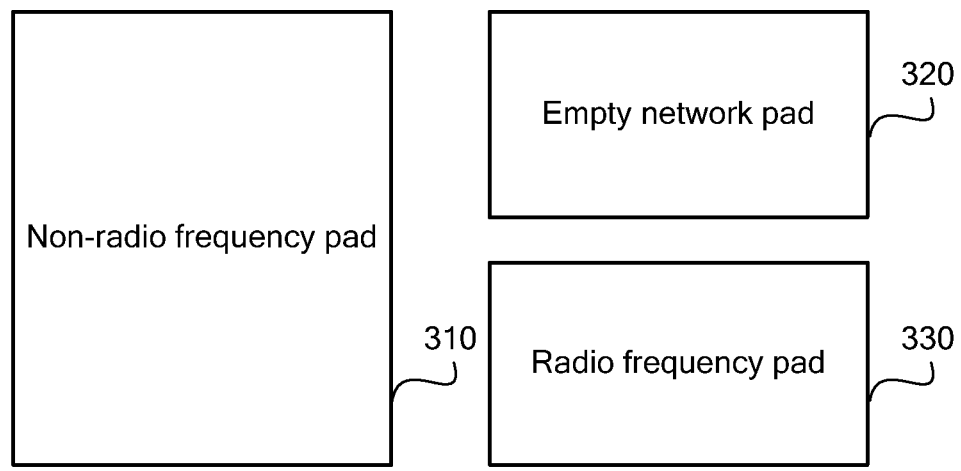
FIG. 3A is a schematic diagram of a non-radio frequency pad, a radio frequency pad, and an empty network pad according to an embodiment of the present invention.

FIG. 3A is a schematic diagram of a non-radio frequency pad, a radio frequency pad, and an empty network pad according to an embodiment of the present invention. FIG. 3A illustrates a non-radio frequency pad, a radio frequency pad, and an empty network pad of the LGA module in the embodiment shown in FIG. 1A using an example.

Refer to FIG. 3A. A preset clearance exists between a radio frequency pad 330 and an empty network pad 320, and a size and a shape of an area jointly occupied by the radio frequency pad 330 and the empty network pad 320 are consistent with a size and a shape of an area occupied by a non-radio frequency pad 310. For example, the area occupied by the radio frequency pad 330 and the empty network pad 320 (including the clearance between the two) is the same as the area of the non-radio frequency pad 310. In addition, the radio frequency pad 330, the empty network pad 320, and the non-radio frequency pad 310 may all be rectangles with right angles.

Figure 3B:
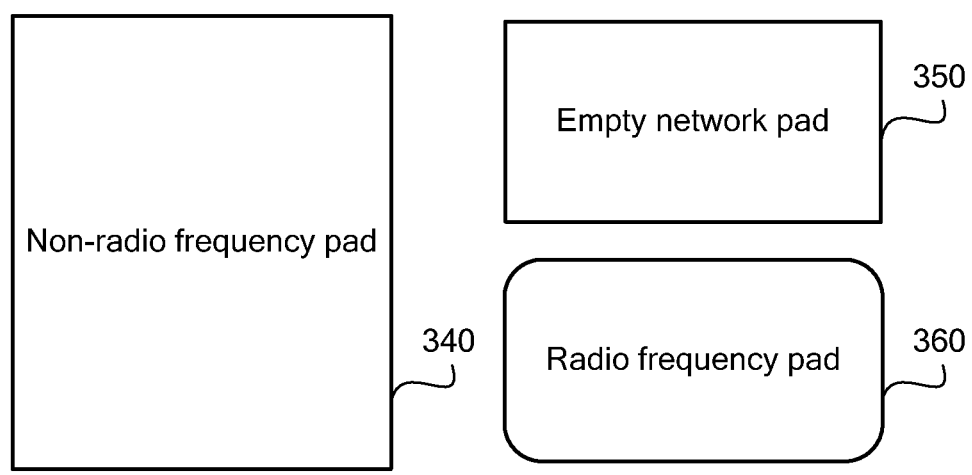
FIG. 3B is a schematic diagram of a non-radio frequency pad, a radio frequency pad, and an empty network pad according to another embodiment of the present invention.

FIG. 3B is a schematic diagram of a non-radio frequency pad, a radio frequency pad, and an empty network pad according to another embodiment of the present invention. A non-radio frequency pad 340, an empty network pad 350, and a radio frequency pad 360 in FIG. 3B are similar to the non-radio frequency pad 310, the empty network pad 320, and the radio frequency pad 330 in FIG. 3A, and a difference is that the radio frequency pad 360 is a rounded rectangle.

Figure 3C:
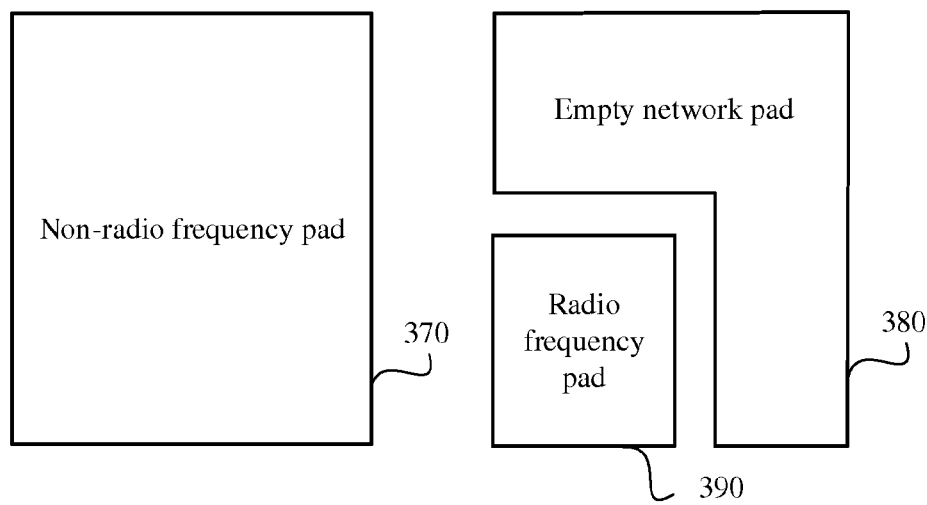
FIG. 3C is a schematic diagram of a non-radio frequency pad, a radio frequency pad, and an empty network pad according to still another embodiment of the present invention.

FIG. 3C is a schematic diagram of a non-radio frequency pad, a radio frequency pad, and an empty network pad according to still another embodiment of the present invention. FIG. 3C illustrates a non-radio frequency pad, a radio frequency pad, and an empty network pad of the LGA module in the embodiment shown in FIG. 1A using an example.

Refer to FIG. 3C. A preset clearance exists between two sides of a radio frequency pad 390 and an empty network pad 380, and a size and a shape of an area jointly occupied by the radio frequency pad 390 and the empty network pad 380 are consistent with a size and a shape of an area occupied by a non-radio frequency pad 370. For example, the area occupied by the radio frequency pad 390 and the empty network pad 380 (including the clearance between the two) is the same as the area of the non-radio frequency pad 370. In this embodiment, shapes of the radio frequency pad 390 and the non-radio frequency pad 370 may be rectangles. The empty network pad 380 may surround or partially surround the radio frequency pad 390. Refer to FIG. 3C. A structure of the empty network pad 380 is of a "⏋" shape, that is, an opening may be provided at the empty network pad 380, and the radio frequency pad 390 may be located at the opening of the empty network pad 380.

Optionally, as another embodiment, a shape of the radio frequency pad 390 in FIG. 3C may also be set to a rounded rectangle.

It should be understood that a non-radio frequency pad and a radio frequency pad of a motherboard correspond to the non-radio frequency pad and the radio frequency pad of the LGA module, and therefore the non-radio frequency pad and the radio frequency pad of the motherboard have a shape and placement similar to the non-radio frequency pad and the radio frequency pad of the LGA module in FIG. 3A to FIG. 3D, which is not described herein again.

Figure 4:
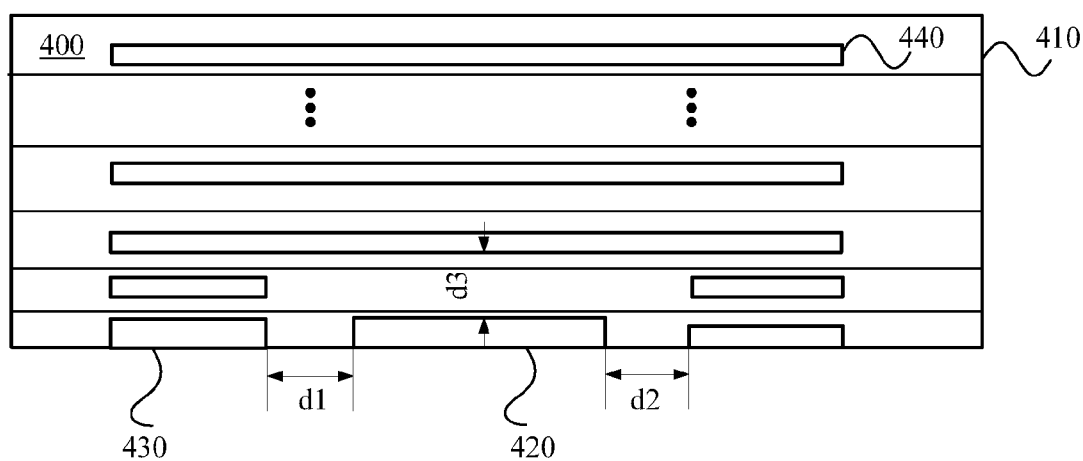
FIG. 4 is a schematic cross-sectional diagram of a printed circuit board of an LGA module according to an embodiment of the present invention.

FIG. 4 is a schematic cross-sectional diagram of a multi-layer printed circuit board 400 of an LGA module according to an embodiment of the present invention. The multi-layer printed circuit board 400 is an example of the first printed circuit board 113 in FIG. 1.

Each layer of printed circuit board in the multi-layer printed circuit board 400 may include a substrate 410 and a printed circuit 440. The printed circuit 440 includes a printed wire. Here, a lower surface of a bottom-layer printed circuit board in the multi-layer printed circuit board 400 may further include: a radio frequency pad 420 and a non-radio frequency pad 430. A distance between the radio frequency pad 420 and a printed wire on the same layer is set to be greater than d2. A distance between the radio frequency pad 420 and the non-radio frequency pad 430 on the same layer is set to be greater than d1. A distance between the radio frequency pad 420 and a printed wire on a layer except the bottom-layer printed circuit board in the multi-layer printed circuit board 400 is set to be greater than d3. For example, it may be that no printed wire is disposed within a range of d3 above the radio frequency pad 420. In this embodiment, no printed circuit is disposed on a part, which is corresponding to the radio frequency pad 420, of a printed circuit board one layer above the bottom-layer printed circuit board. The distances d1 and d3 may be set to be equal. For example, d1=d3=0.2 mm. d2 may be set according to a manufacturing process requirement.

Particularly, a printed wire above the radio frequency pad 420 is a reference ground.

Figure 5:
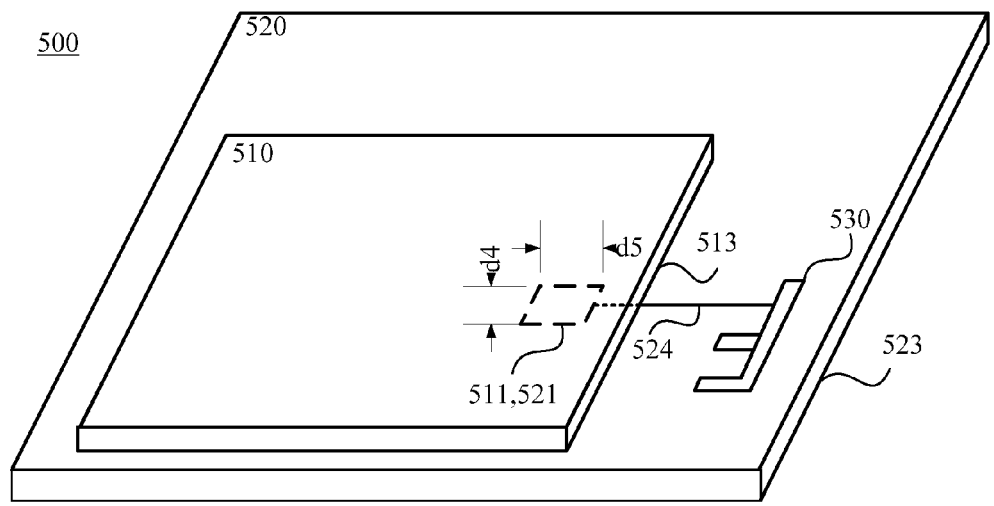
FIG. 5 is a schematic structural diagram of an electronic apparatus according to another embodiment of the present invention.

FIG. 5 is a schematic structural diagram of an electronic apparatus 500 according to another embodiment of the present invention. The electronic apparatus 500 includes a land grid array LGA module 510, a motherboard 520, and an antenna 530.

According to the embodiment of the present invention, the land grid array LGA module 510 includes a first printed circuit board 513. A lower surface of the first printed circuit board 513 is provided with a first radio frequency pad 511. The motherboard 520 includes a second printed circuit board 523. An upper surface of the second printed circuit board 523 is provided with a second radio frequency pad 521. The first radio frequency pad 511 is connected to the second radio frequency pad 521. A range of a length d5 of the first radio frequency pad 511 and the second radio frequency pad 521 is from 0.4 mm and 1.2 mm, and a range of a width d4 of the first radio frequency pad 511 and the second radio frequency pad 521 is from 0.4 mm and 0.8 mm. The antenna 530 is located on the motherboard 520, and is connected to the second radio frequency pad 521 by a wire 524. The first radio frequency pad 511 and the second radio frequency pad 521 are configured to transmit, between the LGA module 510 and the motherboard 520, a radio frequency signal transmitted by the antenna 530.

In the embodiment of the present invention, a radio frequency pad of an LGA module can be connected to a radio frequency pad of a motherboard, and the radio frequency pad of the motherboard is connected to an antenna, so that a radio frequency signal on the LGA module can be transmitted to the antenna. Because the radio frequency pad of the LGA module is located on a bottom surface of the LGA module, and does not occupy space of a top surface of the LGA module, effective layout space of the LGA module is increased.

In addition, in the embodiment of the present invention, a length of the radio frequency pad may be set to 0.4 mm to 1.2 mm, and a width of the radio frequency pad may be set to 0.4 mm to 0.8 mm. In this case, when the LGA module is used to transmit a radio frequency signal to the motherboard, capacitance generated by the radio frequency pad is reduced and impedance continuity of a radio frequency loop is improved, thereby reducing insertion loss and increasing radio frequency sensitivity. Better impedance continuity achieves better impedance convergence in a wide frequency band range, so that testing and adjusting for multiple frequency bands is easier.

According to an embodiment of the present invention, lengths of the first radio frequency pad 511 and the second radio frequency pad 521 are 1.0 mm, and widths of the first radio frequency pad 511 and the second radio frequency pad 521 are 0.6 mm. In this way, it can be ensured that a radio frequency signal has good impedance convergence in a relatively wide frequency band range (for example, 0.7 gigahertz (G) to 4 G).

According to an embodiment of the present invention, a distance between the first radio frequency pad 511 and a printed wire on the lower surface of the first printed circuit board is greater than 0.2 mm; a distance between the second radio frequency pad 521 and a printed wire on the upper surface of the second printed circuit board is greater than 0.2 mm.

According to an embodiment of the present invention, a distance between the first radio frequency pad 511 and a printed wire inside the first printed circuit board 513 is greater than 0.2 mm. The printed wire may be located at a reference ground above the radio frequency pad. In this way, impedance discontinuity of a radio frequency signal at an LGA pad can be avoided.

Optionally, as another embodiment, the lower surface of the first printed circuit board is further provided with a first empty network pad, and a preset clearance exists between the first radio frequency pad and the first empty network pad. The empty network pad may be used to increase soldering reliability between the LGA module and the motherboard, and ensure soldering performance.

Figure 6:
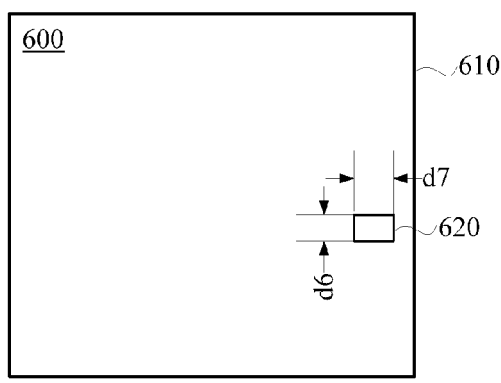
FIG. 6 is a schematic structural diagram of an LGA module according to another embodiment of the present invention.

FIG. 6 is a schematic structural diagram of an LGA module 600 according to another embodiment of the present invention. The LGA module 600 in FIG. 6 is an example of the LGA module 110 in FIG. 1A. The LGA module 600 includes a printed circuit board 610 and a first radio frequency pad 620.

According to the embodiment of the present invention, a lower surface of the printed circuit board 610 is provided with the first radio frequency pad 620. A range of a length d7 of the first radio frequency pad 620 is from 0.4 mm to 1.2 mm. A range of a width d6 of the first radio frequency pad 620 is from 0.4 mm to 0.8 mm.

For example, the first radio frequency pad 620 may be placed on the lower surface of the first printed circuit board 610. An outer surface of the first radio frequency pad 620 may be level with the lower surface of the first printed circuit board 610, but the embodiment of the present invention is not limited thereto. For example, the outer surface of the first radio frequency pad 620 may not be level with the lower surface of the first printed circuit board 610 (for example, higher than or lower than the lower surface of the printed circuit board).

In the embodiment of the present invention, a radio frequency pad may be disposed on a bottom surface (that is, the lower surface) of an LGA module, and configured to connect to a radio frequency pad of a motherboard, so as to connect to an antenna by using the radio frequency pad of the motherboard. Because the radio frequency pad of the LGA module is located on the bottom surface of the LGA module, and does not occupy space of a top surface of the LGA module, effective layout space of the LGA module is increased.

In addition, in the embodiment of the present invention, a length of the radio frequency pad may be set to 0.4 mm to 1.2 mm, and a width of the radio frequency pad may be set to 0.4 mm to 0.8 mm. In this case, when the LGA module is used to transmit a radio frequency signal to the motherboard, capacitance generated by the radio frequency pad is reduced and impedance continuity of a radio frequency loop is improved, thereby reducing insertion loss and increasing radio frequency sensitivity. Better impedance continuity achieves better impedance convergence in a wide frequency band range, so that testing and adjusting for multiple frequency bands is easier.

For example, the length of the first radio frequency pad 620 may be 0.4 mm, 0.5 mm, 0.6 mm, 0.7 mm, 0.8 mm, 0.9 mm, 1.0 mm, 1.1 mm or 1.2 mm. For example, the width of the first radio frequency pad 620 may be 0.4 mm, 0.5 mm, 0.6 mm, 0.7 mm, or 0.8 mm.

According to an embodiment of the present invention, the length of the first radio frequency pad 620 is 1.0 mm, and the width of the first radio frequency pad is 0.6 mm.

According to a result of a performance test conducted on radio frequency pads of various sizes, if a size of a radio frequency pad is less than the smallest size in the foregoing range (for example, the length and the width of the foregoing radio frequency pad are less than 0.4 mm), a cost of an equipment test fixture of an LGA module is increased. If the size of the radio frequency pad is greater than the largest size in the foregoing range (for example, the length of the foregoing radio frequency pad is greater than 1.0 mm and the width is greater than 0.8 mm), impedance continuity deteriorates and insertion loss grows.

According to an embodiment of the present invention, a distance between the first radio frequency pad and a printed wire on the lower surface of the first printed circuit board is greater than 0.2 mm.

According to an embodiment of the present invention, a distance between the first radio frequency pad and a printed wire inside the first printed circuit board is greater than 0.2 mm. In this way, impedance discontinuity of a radio frequency signal at an LGA pad can be avoided.

In other words, in the first printed circuit board, no printed circuit (for example, copper sheet) is disposed within a range of at least 0.2 mm from the radio frequency pad, so as to reduce parasitic capacitance between the radio frequency pad and an adjacent printed circuit or pad, thereby ensuring impedance continuity of a radio frequency path of an antenna.

Optionally, as another embodiment, the lower surface of the first printed circuit board is further provided with a first empty network pad, and a preset clearance exists between the first radio frequency pad and the first empty network pad.

Because a size of a radio frequency pad is less than a size of a non-radio frequency pad, space saved can be used to dispose an empty network pad, and the empty network pad can be used to increase soldering reliability of an LGA module.

Figure 7:
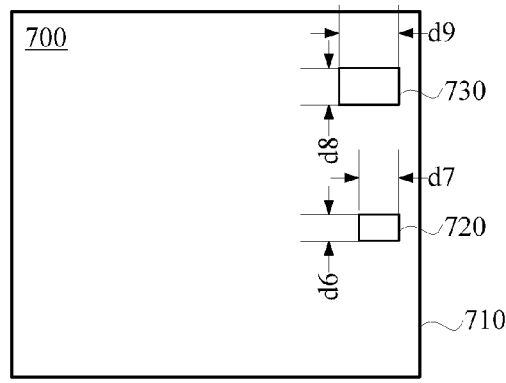
FIG. 7 is a schematic structural diagram of an LGA module according to still another embodiment of the present invention.

FIG. 7 is a schematic structural diagram of an LGA module 700 according to still another embodiment of the present invention.

The LGA module 700 according to the embodiment of the present invention includes a printed circuit board 710. A lower surface of the printed circuit board is provided with a first radio frequency pad 720 and a first non-radio frequency pad 730. A size of the first radio frequency pad 720 is less than a size of the first non-radio frequency pad 730.

According to an embodiment of the present invention, a range of a length d7 of the first radio frequency pad 720 is from 0.4 mm to 1.2 mm, and a range of a width d6 of the first radio frequency pad 720 is from 0.4 mm to 0.8 mm.

According to an embodiment of the present invention, the length d7 of the first radio frequency pad 720 is 1.0 mm, and the width d6 of the first radio frequency pad is 0.6 mm. In this way, it can be ensured that a radio frequency signal has good impedance convergence in a relatively wide frequency band range (for example, 0.7 G to 4 G).

According to an embodiment of the present invention, a distance between the first radio frequency pad 720 and a printed wire on the lower surface of the first printed circuit board 710 is greater than 0.2 mm. In this way, impedance discontinuity of a radio frequency signal at an LGA pad can be avoided, and impedance continuity of a radio frequency path of an antenna is ensured.

According to an embodiment of the present invention, a distance between the first radio frequency pad and a printed wire inside the first printed circuit board 710 is greater than 0.2 mm. In this way, impedance discontinuity of a radio frequency signal at an LGA pad can be avoided.

Figure 8:
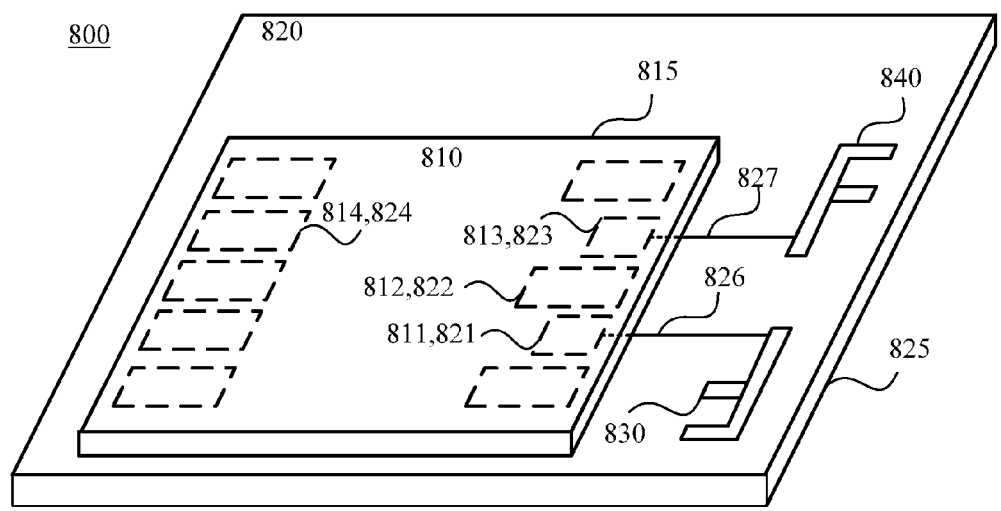
FIG. 8 is a schematic structural diagram of an electronic apparatus according to still another embodiment of the present invention.

FIG. 8 is a schematic structural diagram of an electronic apparatus 800 according to still another embodiment of the present invention, including an LGA module 810, a motherboard 820, a first antenna 830 (for example, a primary antenna) and a second antenna 840 (for example, a secondary antenna).

The LGA module 810 includes a printed circuit board 815. A lower surface of the printed circuit board 815 is provided with a radio frequency pad 811, a radio frequency pad 813, a non-radio frequency pad 812, and a non-radio frequency pad 814. The non-radio frequency pad 812 is located on a side of the lower surface of the printed circuit board of the LGA module 810. The non-radio frequency pad 814 is located on another side of the lower surface of the printed circuit board of the LGA module 810. Multiple non-radio frequency pads 812 and 814 may be disposed on each side of the lower surface of the LGA module 810.

The motherboard 820 includes a printed circuit board 825. An upper surface of the printed circuit board 825 is provided with a radio frequency pad 821, a radio frequency pad 823, a non-radio frequency pad 822, and a non-radio frequency pad 824. Here, the radio frequency pad 821, radio frequency pad 823, non-radio frequency pad 822, and non-radio frequency pad 824 are corresponding to the radio frequency pad 811, radio frequency pad 813, non-radio frequency pad 812, and non-radio frequency pad 814 respectively.

The first antenna 830 is connected to the radio frequency pad 821 through a wire 826 on the printed circuit board 825. The second antenna 840 is connected to the radio frequency pad 823 through a wire 827 on the printed circuit board 825.

Although the radio frequency pad 811 and the radio frequency pad 813 in the embodiment in FIG. 8 are located on a same side of the lower surface of the printed circuit board of the LGA module, a person skilled in the art may understand that, the radio frequency pad 811 and the radio frequency pad 813 may be located on different sides of the lower surface of the printed circuit board of the LGA module according to a requirement (for example, a position of an antenna).

It should be understood that the embodiment in FIG. 8 only describes two radio frequency pads included in the LGA module, but there may be multiple (for example, more than two) radio frequency pads of the LGA module in a case in which there are multiple (for example, more than two) antennas. Correspondingly, there may also be multiple (for example, more than two) radio frequency pads of the motherboard. In addition, in the embodiment in FIG. 8, five pads are shown on each side of the lower surface of the printed circuit board of the LGA module, but embodiments according to the present invention are not limited thereto. Multiple pads may be arranged on each side of the lower surface of the printed circuit board of the LGA module according to sizes of the LGA module and pads.

In the several embodiments provided in the present application, it should be understood that the disclosed apparatus may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located at one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

The foregoing descriptions are merely specific implementation manners of the present invention, and are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An electronic apparatus, comprising:
   a Land Grid Array (LGA) module comprising a first printed circuit board, wherein a lower surface of the first printed circuit board is provided with a first radio frequency pad and a first non-radio frequency pad;
   a motherboard comprising a second printed circuit board, wherein an upper surface of the second printed circuit board is provided with a second radio frequency pad and a second non-radio frequency pad, wherein the first radio frequency pad is connected to the second radio frequency pad, and wherein the first non-radio frequency pad is connected to the second non-radio frequency pad; and
   an antenna located on the motherboard and connected to the second radio frequency pad, wherein a size of the first radio frequency pad is less than a size of the first non-radio frequency pad, wherein a size of the second radio frequency pad is less than a size of the second non-radio frequency pad, and wherein the first radio frequency pad and the second radio frequency pad are configured to transmit, between the LGA module and the motherboard, a radio frequency signal transmitted by the antenna.

2. The electronic apparatus according to claim 1, wherein length ranges of the first radio frequency pad and the second radio frequency pad are from 0.4 millimeters (mm) to 1.2 mm, and width ranges of the first radio frequency pad and the second radio frequency pad are from 0.4 mm to 0.8 mm.

3. The electronic apparatus according to claim 2, wherein lengths of the first radio frequency pad and the second radio frequency pad are 1.0 mm, and wherein widths of the first radio frequency pad and the second radio frequency pad are 0.6 mm.

4. The electronic apparatus according to claim 1, wherein the first radio frequency pad, the first non-radio frequency pad, and the second radio frequency pad are rectangles, wherein a long side of the first radio frequency pad is parallel to a long side of the first non-radio frequency pad, and wherein a short side of the first radio frequency pad is parallel to a short side of the first non-radio frequency pad.

5. The electronic apparatus according to claim 1, wherein the first radio frequency pad, the first non-radio frequency pad, and the second radio frequency pad are rectangles, wherein a short side of the first radio frequency pad is parallel to a long side of the first non-radio frequency pad, and wherein a long side of the first radio frequency pad is parallel to a short side of the first non-radio frequency pad.

6. The electronic apparatus according to claim 1, wherein the lower surface of the first printed circuit board is further provided with a first empty network pad, wherein a preset clearance exists between the first radio frequency pad and the first empty network pad, wherein a size and a shape of an area jointly occupied by the first radio frequency pad and the first empty network pad are consistent with a size and a shape of an area occupied by the first non-radio frequency pad, wherein the upper surface of the second printed circuit board is provided with a second empty network pad, and a preset clearance exists between the second radio frequency pad and the second empty network pad, and wherein the first empty network pad is connected to the second empty network pad.

7. The electronic apparatus according to claim 1, wherein a distance between the first radio frequency pad and a printed wire on the lower surface of the first printed circuit board is greater than 0.2 millimeters (mm), and wherein a distance between the second radio frequency pad and a printed wire on the upper surface of the second printed circuit board is greater than 0.2 mm.

8. The electronic apparatus according to claim 1, wherein a distance between the first radio frequency pad and a printed wire inside the first printed circuit board is greater than 0.2 millimeters (mm).

9. The electronic apparatus according to claim 1, wherein the first radio frequency pad, the first non-radio frequency pad, the second radio frequency pad, and the second non-radio frequency pad are configured to conduct electrical signals.

10. An electronic apparatus, comprising:
    a Land Grid Array (LGA) module comprising a first printed circuit board, wherein a lower surface of the first printed circuit board is provided with a first radio frequency pad;
    a motherboard comprising a second printed circuit board, wherein an upper surface of the second printed circuit board is provided with a second radio frequency pad, wherein the first radio frequency pad is connected to the second radio frequency pad, wherein length ranges of the first radio frequency pad and the second radio frequency pad are from 0.4 millimeters (mm) to 1.2 mm, and wherein width ranges of the first radio frequency pad and the second radio frequency pad are from 0.4 mm to 0.8 mm; and
    an antenna located on the motherboard and connected to the second radio frequency pad, wherein the first radio frequency pad and the second radio frequency pad are configured to transmit, between the LGA module and the motherboard, a radio frequency signal transmitted by the antenna.

11. The electronic apparatus according to claim 10, wherein lengths of the first radio frequency pad and the second radio frequency pad are 1.0 mm, and wherein widths of the first radio frequency pad and the second radio frequency pad are 0.6 mm.

12. The electronic apparatus according to claim 10, wherein a distance between the first radio frequency pad and a printed wire on the lower surface of the first printed circuit board is greater than 0.2 mm, and wherein a distance between the second radio frequency pad and a printed wire on the upper surface of the second printed circuit board is greater than 0.2 mm.

13. The electronic apparatus according to claim 10, wherein the lower surface of the first printed circuit hoard is further provided with a first non-radio frequency pad, wherein the upper surface of the second printed circuit board is further provided with a second non-radio frequency pad, wherein the first non-radio frequency pad is connected to the second non-radio frequency pad, and wherein the first radio frequency pad, the first non radio frequency pad, the second radio frequency pad, and the second non-radio frequency pad are configured to conduct electrical signals.

14. An electronic apparatus, comprising:
    a Land Grid Array (LGA) module comprising a first printed circuit hoard, wherein a lower surface of the first printed circuit board is provided with a first radio frequency pad and a first non-radio frequency pad;
    a motherboard comprising a second printed circuit board, wherein an upper surface of the second printed circuit board is provided with a second radio frequency pad and a second non-radio frequency pad, wherein the first radio frequency pad is coupled to the second radio frequency pad, and wherein the first non-radio frequency pad is coupled to the second non-radio frequency pad; and
    an antenna located on the motherboard and coupled to the second radio frequency pad,
    wherein the first radio frequency pad, the first non-radio frequency pad, the second radio frequency pad, and the second non-radio frequency pad are configured to conduct electrical signals, and
    wherein the first radio frequency pad and the second radio frequency pad are configured to transmit, between the LGA module and the motherboard, a radio frequency signal transmitted by the antenna.

15. The electronic apparatus according to claim 14, wherein the lower surface of the first printed circuit board is further provided with a first non-radio frequency pad, wherein the upper surface of the second printed circuit board is further provided with a second non-radio frequency pad, wherein the first non-radio frequency pad is connected to the second non-radio frequency pad, wherein a size of the first radio frequency pad is less than a size of the first non-radio frequency pad, and wherein a size of the second radio frequency pad is less than a size of the second non-radio frequency pad.

16. The electronic apparatus according to claim 14, wherein the first radio frequency pad, the first non-radio frequency pad, and the second radio frequency pad are rectangles, wherein a long side of the first radio frequency pad is parallel to a long side of the first non-radio frequency pad, and wherein a short side of the first radio frequency pad is parallel to a short side of the first non-radio frequency pad.

17. The electronic apparatus according to claim 14, wherein the first radio frequency pad, the first non-radio frequency pad, and the second radio frequency pad are rectangles, wherein a short side of the first radio frequency pad is parallel to a long side of the first non-radio frequency pad, and wherein a long side of the first radio frequency pad is parallel to a short side of the first non-radio frequency pad.

18. The electronic apparatus according to claim 14, wherein the lower surface of the first printed circuit board is further provided with a first empty network pad, wherein a preset clearance exists between the first radio frequency pad and the first empty network pad, wherein a size and a shape of an area jointly occupied by the first radio frequency pad and the first empty network pad are consistent with a size and a shape of an area occupied by the first non-radio frequency pad, wherein the upper surface of the second printed circuit board is provided with a second empty network pad, and a preset clearance exists between the second radio frequency pad and the second empty network pad, and wherein the first empty network pad is connected to the second empty network pad.

19. The electronic apparatus according to claim 14, wherein a distance between the first radio frequency pad and a printed wire on the lower surface of the first printed circuit board is greater than 0.2 millimeters (mm), and wherein a distance between the second radio frequency pad and a printed wire on the upper surface of the second printed circuit board is greater than 0.2 mm.

20. The electronic apparatus according to claim 14, wherein a distance between the first radio frequency pad and a printed wire inside the first printed circuit board is greater than 0.2 millimeters (mm).

* * * * *

UNITED STATES PATENT AND TRADEMARK OFFICE
CERTIFICATE OF CORRECTION

| | | |
|---|---|---|
| PATENT NO. | : 9,905,918 B2 | |
| APPLICATION NO. | : 14/580991 | |
| DATED | : February 27, 2018 | |
| INVENTOR(S) | : Benwei Huang | |

It is certified that error appears in the above-identified patent and that said Letters Patent is hereby corrected as shown below:

On the Title Page

Page 2 Column 2 under Foreign Patent Documents should read:
CN 101542830 A 9/2009

Page 2 Column 2 under Foreign Patent Documents should read:
CN 101996979 A 3/2011

In the Claims

Column 18; Line 16; Claim 14 should read:
printed circuit board wherein a lower surface of the Signed and Sealed this
First Day of May, 2018

Andrei Iancu
*Director of the United States Patent and Trademark Office*